US006467185B1

(12) United States Patent
Mitsch et al.

(10) Patent No.: US 6,467,185 B1
(45) Date of Patent: Oct. 22, 2002

(54) POTTED TIMER AND CIRCUIT BOARD ASSEMBLY FOR USE IN A REGENERATIVE DESICCANT AIR DRYER

(75) Inventors: Matthew D. Mitsch, Pittsburgh; James Varney, North Huntingdon, both of PA (US)

(73) Assignee: Westinghouse Air Brake Technologies Corporation, Wilmerding, PA (US)

( * ) Notice: Subject to any disclaimer, the term of this patent is extended or adjusted under 35 U.S.C. 154(b) by 119 days.

(21) Appl. No.: 09/736,596

(22) Filed: Dec. 13, 2000

(51) Int. Cl.$^7$ .............................................. F26B 21/06
(52) U.S. Cl. ................................ 34/80; 34/82; 34/527; 361/748; 361/752; 361/753; 361/770; 96/115; 96/130
(58) Field of Search ........................... 34/330, 472, 79, 34/80, 82, 527, 562; 361/748, 752, 753, 758, 767, 770; 96/114, 115, 130

(56) References Cited

U.S. PATENT DOCUMENTS

| | | | | |
|---|---|---|---|---|
| 4,546,442 A | * | 10/1985 | Tinker | 364/500 |
| 5,412,159 A | * | 5/1995 | Wiltgen et al. | 174/250 |
| 5,715,621 A | * | 2/1998 | Mitsch | 34/80 |
| 5,812,387 A | * | 9/1998 | Lu et al. | 363/144 |
| 5,867,371 A | * | 2/1999 | Denzene et al. | 361/816 |

OTHER PUBLICATIONS

Graham–White 500–975–145 Series Maintenance Brochure Jun. 1992.

* cited by examiner

Primary Examiner—Pamela Wilson
(74) Attorney, Agent, or Firm—James Ray & Associates

(57) ABSTRACT

A potted timer and circuit board assembly for use in a regenerative desiccant air dryer. The potted timer and circuit board assembly comprise a support member of a predetermined size and shape having a first surface and a second surface. A conductive pattern of a predetermined material and thickness is disposed on at least one of the first surface and the second surface of the support member. A predetermined quantity and arrangement of electronic components of a predetermined voltage is disposed on at least one of the first surface and the second surface of the support member for providing a timed electronic signal to a solenoid valve that pneumatically operates an air dryer. A non-conductive material of a predetermined composition encases the electronic components on the support member for insulating the electronic components from environmental elements. The support member has at least one exposed member on a side of the support member for engagement with at least one receptacle on such air dryer for creating an electrical current in the potted timer and circuit board assembly. An alignment means is disposed on at least one of opposing sides of the support member for engagement with at least one slot in such air dryer for aligning and holding the potted timer and circuit board assembly in a predetermined position in such air dryer.

20 Claims, 2 Drawing Sheets

POTTED TIMER AND CIRCUIT BOARD ASSEMBLY FOR USE IN A REGENERATIVE DESICCANT AIR DRYER

FIELD OF THE INVENTION

The present invention relates, in general, to a timer and circuit board assembly, and more particularly, to an improved timer and circuit board assembly for use in a regenerative desiccant air dryer.

BACKGROUND OF THE INVENTION

Prior to the present invention, the electronic components of a timer and circuit board assembly for use in a regenerative desiccant air dryer are mounted on the circuit board, which is inserted into a housing in the air dryer. To minimize exposure to undesirable environmental elements such as water or dirt, which can potentially cause failure, a tight fitting gasket is required between the housing and the housing cover. The seal of this gasket is critical to the proper function and consistent operation of the timer and circuit board assembly. If the seal fails in service, water and dirt can infiltrate the circuit board. This exposure makes the electronic components on the board extremely vulnerable to failure by creating a bridge between the exposed electrical circuits.

An example of this type of timer and circuit board assembly is taught in the Graham-White 975 Series Twin Tower Air Filter Dryer. The teachings of this reference are incorporated herein by reference thereto.

SUMMARY OF THE INVENTION

In a first aspect, the present invention provides a potted timer and circuit board assembly for use in a regenerative desiccant air dryer. The potted timer and circuit board assembly comprises a support member of a predetermined size and shape having a first surface and a second surface. A conductive pattern of a predetermined material and thickness is disposed on at least one of the first surface and the second surface of the support member. A predetermined quantity and arrangement of electronic components of a predetermined voltage is disposed on at least one of the first surface and the second surface of the support member for providing a timed electronic signal to a solenoid valve that pneumatically operates an air dryer. A non-conductive material of a predetermined composition encases the electronic components on the support member for insulating the electronic components from environmental elements. At least one exposed member on a side of the support member engages with at least one receptacle on an air dryer for creating an electrical current in the potted timer and circuit board assembly. An alignment means is disposed on at least one of the opposing sides of the support member for engagement with at least one slot in an air dryer for aligning and holding the potted timer and circuit board assembly in a predetermined position in an air dryer.

In still a further aspect, the present invention provides a potted timer and circuit board assembly in combination with a regenerative desiccant air dryer having a dehydrating dryer, a regenerating dryer, outlet check valves, inlet check valves, solenoid valves, a pre-coalescer, purge valves, and a drain valve. The improvement comprises a support member of a predetermined size and shape having a first surface and a second surface. A conductive pattern of a predetermined material and thickness is disposed on at least one of the first surface and the second surface of the support member. A predetermined quantity and arrangement of electronic components of a predetermined voltage is disposed on at least one of the first surface and the second surface of the support member for providing a timed electronic signal to a solenoid valve that pneumatically operates an air dryer. A non-conductive material of a predetermined composition encases the electronic components on the support member for insulating the electronic components from environmental elements. At least one exposed member on a side of the support member engages with at least one receptacle on an air dryer for creating an electrical current in the potted timer and circuit board assembly. An alignment means is disposed on at least one of the opposing sides of the support member for engagement with at least one slot in an air dryer for aligning and holding the potted timer and circuit board assembly in a predetermined position in an air dryer.

In addition to the various objects of the invention that have been described above, various other objects and advantages of the invention will become more readily apparent to those persons skilled in the relevant art from the following more detailed description of the invention, particularly, when such description is taken in conjunction with the attached drawing figures and the appended claims.

BRIEF DESCRIPTION OF A PRESENTLY PREFERRED AND

VARIOUS ALTERNATIVE EMBODIMENTS OF THE PRESENT INVENTION

Figure 1:
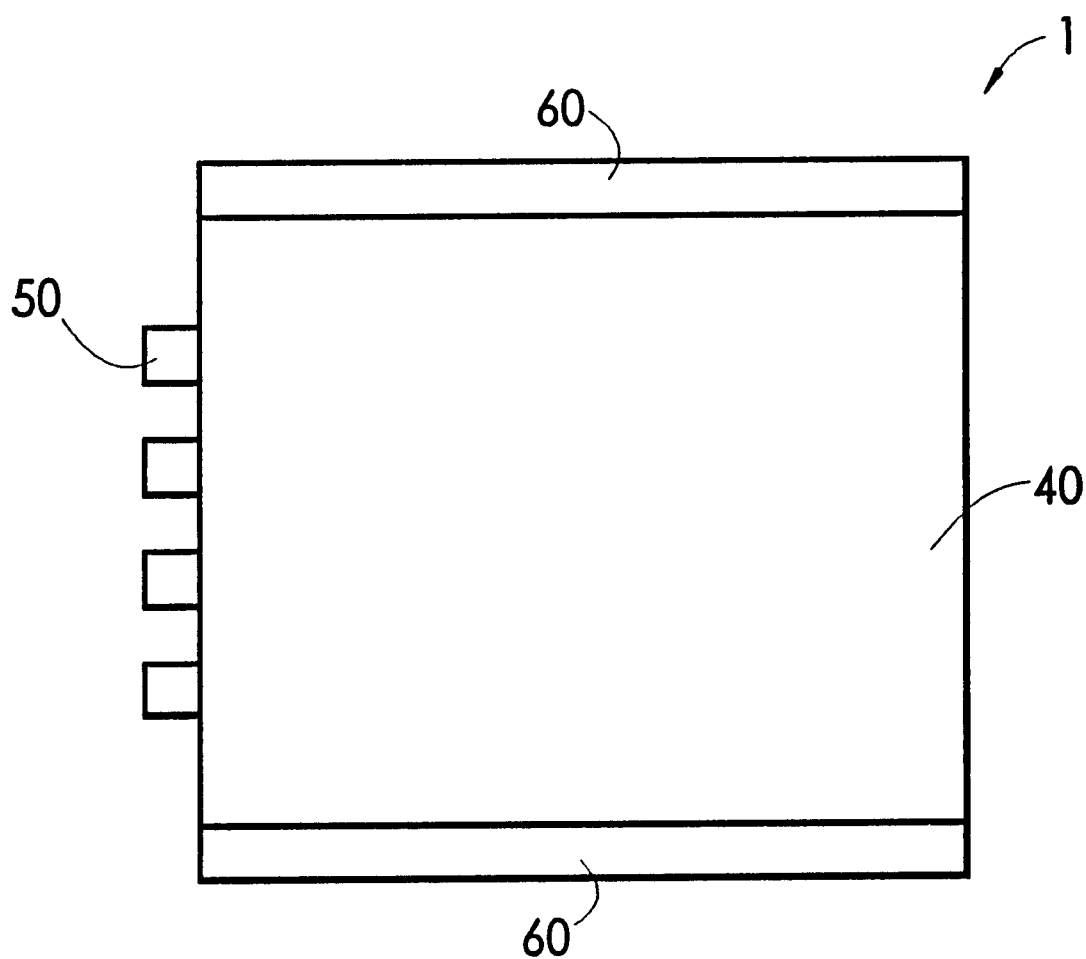
FIG. 1 is a top view of the potted timer and circuit board.

Prior to proceeding to a more detailed description of the invention, it should be noted that identical components having identical functions have been designated with identical reference numerals for the sake of clarity.

Figure 2:
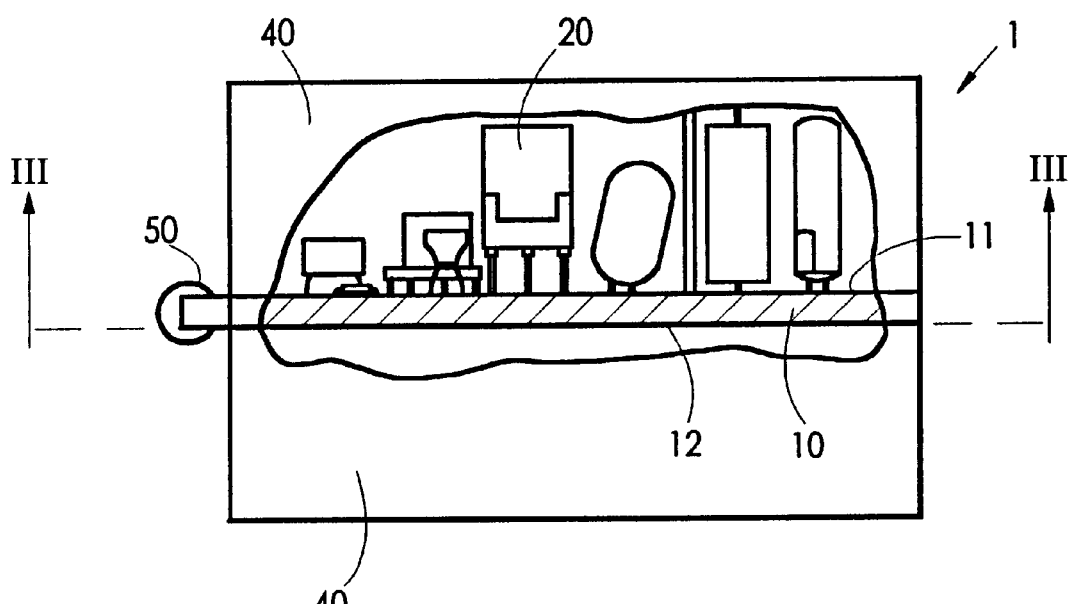
FIG. 2 is a vertical view of the potted timer and circuit board with a partial sectional view.
Figure 3:
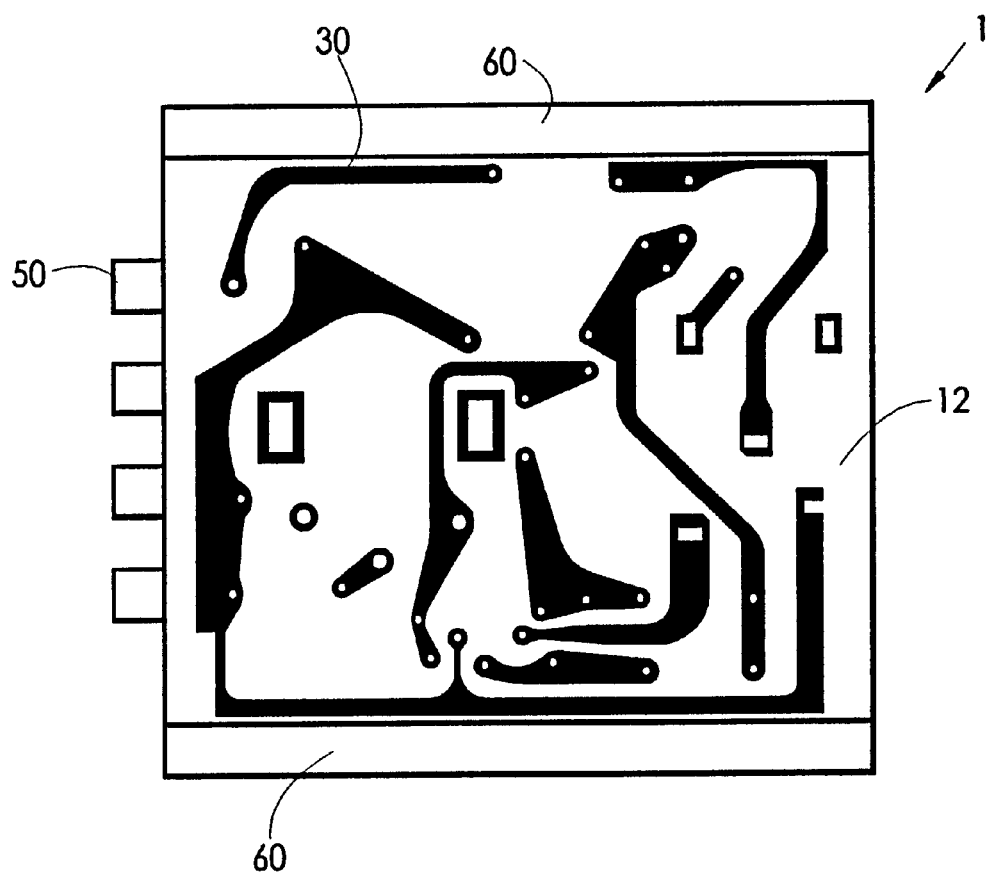
FIG. 3 is a bottom sectional view of the potted timer and circuit board taken along the lines III—III of FIG. 2.

Now refer more particularly to FIGS. 1, 2 and 3 of the drawings. Illustrated therein is a device, generally designated 1, of a potted timer and circuit board assembly. The potted timer and circuit board assembly 1 comprise a support member 10 having a first surface 11 and a second surface. Preferably, the support member 10 includes a laminated substrate layer composed of at least one of paper, glass, and glass fiber combined with a bonding material. The preferred bonding material is at least one of phenolic resin, a polyester resin, and an epoxy resin. A conductive pattern 30 of a predetermined material and thickness is disposed on at least one of the first surface 11 and the second surface 12 of the support member 10. Preferably, the material of the conductive pattern 30 is copper foil. A predetermined quantity and arrangement of electronic components 20 of a predetermined voltage is disposed on at least one of the first surface 11 and the second surface 12 of the support member 10. This arrangement provides a timed electronic signal to a solenoid valve (not shown) that pneumatically operates an air dryer (not shown). Preferably, the quantity and arrangement of electronic components 20 is disposed on the first side 11 of the support member 10, and the predetermined voltage is generally about 74 DC. A non-conductive material 40 of a predetermined composition encases the electronic components 20 on the support member 10 for insulating the electronic components 20 from environmental elements.

The non-conductive material 40 is a synthetic resin, preferably epoxy. The potted timer and circuit board assembly 1 has at least one exposed member 50 on a side of the support member 10 for engagement with at least one receptacle (not shown) on an air dryer (not shown) for creating an electrical circuit in the potted timer and circuit board assembly 1. It is preferred that the exposed member 50 is a plurality of four projections of a predetermined size and shape. An alignment means 60 is disposed on at least one of the opposing sides of the support member 10 for engagement with at least one slot (not shown) in an air dryer (not shown) for aligning and holding the potted timer and circuit board assembly 1 in a predetermined position in an air dryer. Preferably, the alignment means 60 includes two exposed portions of the support member 10 disposed opposite each other and perpendicular to the side of the exposed member 50.

Now refer more particularly to FIGS. 1, 2, and 3, of the drawings. Illustrated therein is a potted timer and circuit board assembly in combination with a regenerative desiccant air dryer (not shown) having a dehydrating dryer, a regenerating dryer, outlet check valves, inlet check valves, solenoid valves, a pre-coalescer, purge valves, and a drain valve. The improvement comprises a support member 10 of a predetermined size and shape having a first surface 11 and a second surface 12. Preferably, the support member 10 includes a laminated substrate layer composed of at least one of paper, glass, and glass fiber combined with a bonding material such as at least one of phenolic resin, a polyester resin, and an epoxy resin. A conductive pattern 30 of a predetermined material and thickness is disposed on at least one of the first surface 11 and the second surface 12. The preferred material of the conductive pattern 30 is copper foil. A predetermined quantity and arrangement of electronic components 20 of a predetermined voltage is disposed on at least one of the first surface 11 and the second surface 12 of the support member 10 for providing a timed electronic signal to a solenoid valve that pneumatically operates an air dryer. Preferably, the electronic components 20 are disposed on the first side 11 of the support member 10, and the predetermined voltage is generally about 74 DC. A non-conductive material 40 of a predetermined composition encases the electronic components 20 on the support member 10 for insulating the electronic components 20 from environmental elements. The preferred non-conductive material 40 is a synthetic resin, wherein the synthetic resin is epoxy. At least one exposed member 50 on a side of the support member 10 is engageable with at least one receptacle on an air dryer for creating an electrical current in the potted timer and circuit board assembly 1. Preferably, the exposed member 50 is a projection of a predetermined size and shape. It is also preferred that the projection is a plurality of four. An alignment means 60 is disposed on at least one of opposing sides of the support member 10 for engagement with at least one slot in an air dryer for aligning and holding the potted timer and circuit board assembly 1 in a predetermined position in an air dryer. Preferably, the alignment means 60 includes two exposed portions of the support member 10 disposed opposite each other and perpendicular to the side of said exposed member 50.

Although the invention has been shown in connection with a certain specific embodiment, it will be readily apparent to those skilled in the art that various changes in form and arrangement of parts and method may be made to suit requirements without departing from the spirit and scope of the invention.

We claim:

1. A potted timer and circuit board assembly for use in a regenerative desiccant air dryer, said potted timer and circuit board assembly comprising:

(a) a support member of a predetermined size and shape having a first surface and a second surface;
    (b) a conductive pattern of a predetermined material and thickness disposed on at least one of said first surface and said second surface of said support member;
    (c) a predetermined quantity and arrangement of electronic components of a predetermined voltage disposed on at least one of said first surface and said second surface of said support member for providing a timed electronic signal to a solenoid valve that pneumatically operates such air dryer;
    (d) a non-conductive material of a predetermined composition encasing said electronic components on said support member for insulating said electronic components from environmental elements;
    (e) at least one exposed member on a side of said support member for engagement with at least one receptacle on such air dryer for creating an electrical current in said potted timer and circuit board assembly; and
    (f) an alignment means disposed on at least one of opposing sides of said support member for engagement with at least one slot in such air dryer for aligning and holding said potted timer and circuit board assembly in a predetermined position in such air dryer.

2. The potted timer and circuit board assembly according to claim 1 wherein said support member includes a laminated substrate layer composed of at least one of paper, glass, and glass fiber combined with a bonding material.

3. The potted timer and circuit board assembly according to claim 2 wherein said bonding material is at least one of phenolic resin, a polyester resin, and an epoxy resin.

4. The potted timer and circuit board assembly according to claim 1 wherein said material of said conductive pattern is copper foil.

5. The potted timer and circuit board assembly according to claim 1 wherein said predetermined quantity and arrangement of electronic components for a predetermined voltage are disposed on said first side of said support member.

6. The potted timer and circuit board assembly according to claim 1 wherein said predetermined voltage is generally about 74 DC.

7. The potted timer and circuit board assembly according to claim 1 wherein said non-conductive material is a synthetic resin.

8. The potted timer and circuit board assembly according to claim 7 wherein said synthetic resin is an epoxy.

9. The potted timer and circuit board assembly according to claim 1 wherein said exposed member is a projection of a predetermined size and shape.

10. The potted timer and circuit board assembly according to claim 9 wherein said support member includes a plurality of projections.

11. The potted timer and circuit board assembly according to claim 10 wherein said plurality is four.

12. The potted timer and circuit board assembly according to claim 1 wherein said alignment means includes two exposed portions of the support member disposed opposite each other and perpendicular to the side of said exposed member.

13. In combination with a regenerative desiccant air dryer having a dehydrating dryer, a regenerating dryer, outlet check valves, inlet check valves, solenoid valves, a pre-coalescer, purge valves, and a drain valve, the improvement comprising a potted timer and circuit board assembly including:

(a) a support member of a predetermined size and shape having a first surface and a second surface;

(b) a conductive pattern of a predetermined material and thickness disposed on at least one of said first surface and said second surface of said support member;

(c) a predetermined quantity and arrangement of electronic components of a predetermined voltage disposed on at least one of said first surface and said second surface of said support member for providing a timed electronic signal to a solenoid valve that pneumatically operates such air dryer;

(d) a non-conductive material of a predetermined composition encasing said electronic components on said support member for insulating said electronic components from environmental elements;

e) at least one exposed member on a side of said support member for engagement with at least one receptacle on such air dryer for creating an electrical current in said potted timer and circuit board assembly; and (f) an alignment means disposed on at least one of opposing sides of said support member for engagement with at least one slot in such air dryer for aligning and holding said potted timer and circuit board assembly in a predetermined position in such air dryer.

14. The combination according to claim 13 wherein said support member includes a laminated substrate layer composed of at least one of paper, glass, and glass fiber combined with a bonding material.

15. The combination according to claim 13 wherein said material of said conductive pattern is copper foil.

16. The combination according to claim 13 wherein said predetermined quantity and arrangement of electronic components for a predetermined voltage are disposed on said first side of said support member.

17. The combination according to claim 13 wherein said non-conductive material is a synthetic resin.

18. The combination according to claim 13 wherein said exposed member is a projection of a predetermined size and shape.

19. The combination according to claim 18 wherein said support member includes a plurality of projections.

20. The combination according to claim 13 wherein said alignment means include two exposed portions of the support member disposed opposite each other and perpendicular to the side of said exposed member.

* * * * *